United States Patent
Chowdhury et al.

(10) Patent No.: US 11,322,636 B2
(45) Date of Patent: May 3, 2022

(54) PHOTODIODE

(71) Applicant: GLOBALFOUNDRIES U.S. INC., Santa Clara, CA (US)

(72) Inventors: Asif J. Chowdhury, Troy, NY (US); Ajey Poovannummoottil Jacob, Watervliet, NY (US); Yusheng Bian, Ballston Lake, NY (US); Michal Rakowski, Ballston Spa, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 277 days.

(21) Appl. No.: 16/799,183

(22) Filed: Feb. 24, 2020

(65) Prior Publication Data

US 2021/0265519 A1 Aug. 26, 2021

(51) Int. Cl.
  *H01L 31/107* (2006.01)
  *H01L 31/0232* (2014.01)
  *H01L 31/02* (2006.01)

(52) U.S. Cl.
  CPC ...... *H01L 31/107* (2013.01); *H01L 31/02027* (2013.01); *H01L 31/0232* (2013.01)

(58) Field of Classification Search
  None
  See application file for complete search history.

(56) References Cited

U.S. PATENT DOCUMENTS

| | | | | |
|---|---|---|---|---|
| 6,027,956 | A * | 2/2000 | Irissou | H01L 31/105 438/68 |
| 10,446,700 | B2 * | 10/2019 | Wang | H04B 10/40 |
| 2013/0009265 | A1 * | 1/2013 | Dautet | H01L 31/107 257/438 |
| 2014/0042581 | A1 * | 2/2014 | Mheen | H01L 31/18 257/438 |

OTHER PUBLICATIONS

Zeng, et al., "Silicon-germanium avalanche photodiodes with direct control of electric field in charge multiplication region", Optical Society of America, Jun. 2019, 6 pages.
Kang, et al., "Monolithic germanium/silicon avalanche photodiodes with 340 GHz gain-bandwidth product", Nature Photonics, Dec. 7, 2008, 5 pages.
Kang, et al., "High Performance Ge/Si Avalanche Photodiodes Development in Intel", Optical Society of America, In Optical Fiber Communication Conference/National Fiber Optic Engineers Conference, 2011, 3 pages.
Huang et al., "25Gb/s Normal Incident Ge/Si Avalanche Photodiode", The European Conference on Optical Communication (ECOC), 2014, 3 pages.
(Continued)

*Primary Examiner* — Evren Seven
(74) *Attorney, Agent, or Firm* — David Cain; Andrew M. Calderon; Roberts Calderon Safran & Cole, P.C.

(57) ABSTRACT

The present disclosure relates to semiconductor structures and, more particularly, to photodiode structures and methods of manufacture. The structure includes: a charge region having a first doping concentration and a variable width; a multiplication region adjacent to the charge region; and an absorption region adjacent to the variable width charge region.

20 Claims, 9 Drawing Sheets

(56) References Cited

OTHER PUBLICATIONS

Huang et al., "Breakthrough of 25Gb/s Germanium on Silicon Avalanche Photodiode", Optical Society of America, In Optical Fiber Communication Conference, 2016, 3 pages.
Sze et al., "Physics of Semiconductor Devices", Wiley Interscience, 3rd Edition, 2006, 5 pages.
Martinez, et al. "High performance waveguide-coupled Ge-on-Si linear mode avalanche photodiodes", Optics Express 19072, 2016, vol. 24, No. 17, 10 pages.
Samani et al. "Highly Sensitive, 112 GB/s O-band Waveguide Coupled Silicon-Germanium Avalanche Photodetectors", Optical Society of America, Optical Fiber Communication Conference, 2019, 3 pages.
Lambrecht et al., "56-GB/s Silicon Optical Receiver Using a Low-Noise Fully-Differential Transimpedance Amplifier in SiGe SiCMOS", Journal of Lightwave Technology, 2019, 3 pages.
Giewont et al., "300-mm Monolithic Silicon Photonics Foundry Technology", IEEE, 2019, vol. 25, No. 5, 11 pages.
Friedman et al., "Physics of Semiconductor Devices", sMIM Measurement of Planar Doping Calibration Sample, accessed Nov. 21, 2019, 4 pages.

\* cited by examiner

PHOTODIODE

FIELD OF THE INVENTION

The present disclosure relates to semiconductor structures and, more particularly, to photodiode structures and methods of manufacture.

BACKGROUND

An avalanche photodiode (APD) is a highly sensitive semiconductor photodiode that exploits the photoelectric effect to convert light into electricity. From a functional standpoint, the avalanche photodiode can be regarded as an analog of a photomultiplier. Typical applications for avalanche photodiodes are, for example, long-range fiber-optic telecommunication and quantum sensing. Additional applications, amongst others, include positron emission tomography and particle physics.

In current avalanche photodiodes, there are trade-offs between dark current and breakdown voltage. For example, by having separate absorption, charge and multiplication regions, high dark current can been reduced, but this induces high breakdown voltage. Moreover, by having a multiplication region inside the absorption region, the high breakdown voltage can be reduced, however, there is a high dark current.

SUMMARY

In an aspect of the disclosure, a structure comprises: a charge region having a first doping concentration and a variable width; a multiplication region adjacent to the variable width charge region; and an absorption region adjacent to the variable width charge region.

In an aspect of the disclosure, a structure comprises: a waveguide structure comprising intrinsic semiconductor material; a charge region having a doping concentration of a first type and a variable width; a multiplication region adjacent to the variable width charge region and being composed of the intrinsic semiconductor material; and an absorption region adjacent to the waveguide structure and the variable width charge region, the absorption region being composed of the same or different material than the charge region and the multiplication region.

In an aspect of the disclosure, a structure comprises: a first semiconductor region having a first dopant concentration of a first type; a second semiconductor region adjacent to the first semiconductor region and having a second dopant concentration of the first type that is different than the first dopant concentration of the first type; a waveguide structure comprising intrinsic semiconductor material; a charge region having a third doping concentration of the first type and a variable width; a multiplication region adjacent to the variable width charge region and being composed of the intrinsic semiconductor material; an absorption region adjacent to the waveguide structure and the variable width charge region; a third semiconductor region adjacent to the multiplication region and having a first dopant concentration of a second type; and a fourth semiconductor region adjacent to the third semiconductor region and having a second dopant concentration of the second type, the second dopant concentration being different than the first dopant concentration of the second type.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to photodiode structures and methods of manufacture. More specifically, the present disclosure relates to avalanche photodiode (APD) structures with a variable width charge region and/or multiplication region. By way of example, the avalanche photodiode includes a separate absorption region, charge region and multiplication region, where the width of both the charge region and the multiplication regions can vary. Advantageously, the present disclosure provides reduced breakdown voltage without increasing dark current, in addition to reducing avalanche noise due to a reduced multiplication region.

In embodiments, the avalanche photodiodes described herein include separate absorption, charge and multiplication regions, where the charge region (and multiplication region) includes a layer of material in a corrugated (e.g., at least two different widths) or tapered configuration. In further embodiments, the charge region can include an overlap charge region within a Ge or Si absorption region. By providing a variable width of the charge region and the multiplication region, it is now possible to individually adjust the dark current and breakdown voltage by varying the pitch and/or other dimensions of the charge region and multiplication region.

In embodiments, the absorption region can be silicon or germanium or any other compound semiconductors. The charge region and multiplication region, on the other hand, can be composed of any other appropriate semiconductor material. In embodiments, the charge region and the multiplication region can be of the same type of material as the absorption region, but with a different doping concentration. In further embodiments, the charge region and the multiplication region can also be of a different material than used in the absorption region. Moreover, the avalanche photodiodes can be fabricated on semiconductor (silicon) on insulator (SOI) technologies or bulk substrates with silicon, germanium or a compound semiconductor as the platform.

Figure 1:
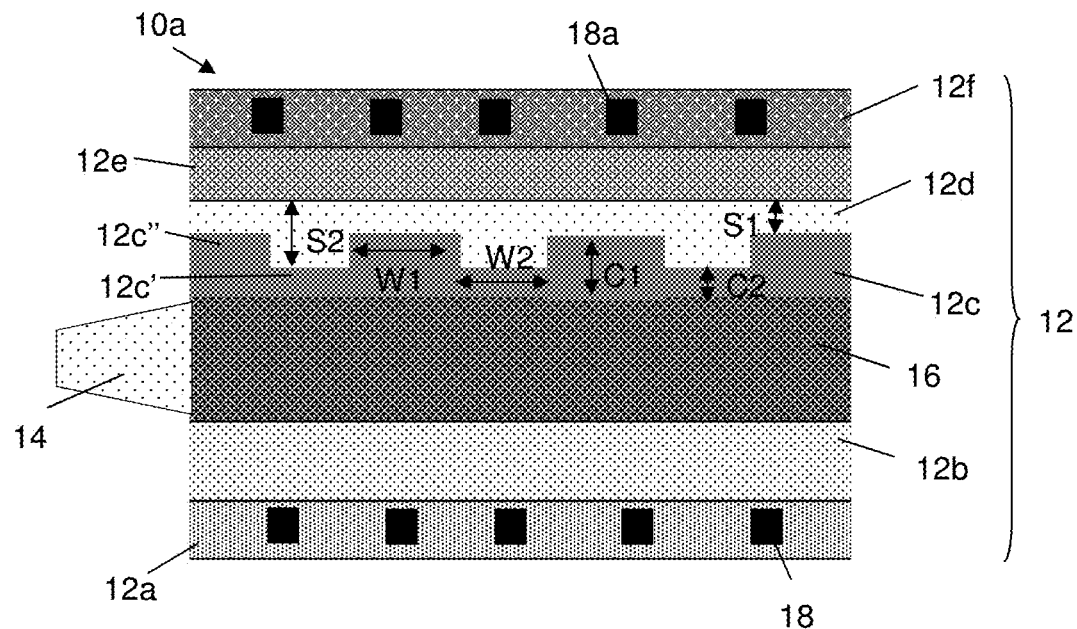
FIG. 1 shows a top down view of an avalanche photodiode in accordance with aspects of the present disclosure.

FIG. 1 shows a top down view of an avalanche photodiode in accordance with aspects of the present disclosure. More specifically, the avalanche photodiode 10a of FIG. 1 includes a substrate 12, which can be fabricated on semiconductor (silicon) on insulator (SOI) technologies or bulk substrates with silicon (Si), germanium (Ge) or a compound semiconductor as the platform. By way of non-limiting illustrative examples, the substrate 12 may be composed of any suitable material including, but not limited to, Si, SiGe, SiGeC, SiC, GaAs, InAs, InP, and other III/V or II/VI compound semiconductors.

The substrate 12 includes a P+ region 12a and a P region 12b. In embodiments, the P+ region 12a is an anode region which includes contacts 18. The P+ region 12a has a higher doping concentration than the P region 12b, which is to establish ohmic contact between the semiconductor material, e.g., substrate 12, and the metal of the contact 18. Moreover, the P+ region 12a and the P region 12b do not have a very high doping concentration in order to avoid unwanted noise and to further reduce the capacitance (i.e., lower doping profile generally helps to reduce the capacitance) of the p-n junction. For this reason, it should be understood by those of skill in the art that the photodiode 10a uses a P+ region (instead of p++/n++ regions) to form the desired p-n junctions. In embodiments, the P type dopant can be boron as an illustrative example.

The substrate 12 further includes N region 12e and N+ region 12f. In embodiments, the N+ region 12f is cathode region which includes contacts 18a. The N+ region 12f has a higher doping concentration than the N region 12e, again primarily to establish ohmic contact between the semiconductor material, e.g., substrate 12, and the metal of the contact 18a. In embodiments, the N type dopant can be phosphorous as an illustrative example.

Still referring to FIG. 1, the substrate 12 further includes an intrinsic region 12d and a P- doped region 12c. In embodiments, the intrinsic region 12d is a separate multiplication region and the P- doped region 12c is a separate charge region, both of which have a varying width as further described herein. In embodiments, the P- doped region 12c, e.g., charge region, has a lower doping concentration than the P+ region 12a and the P region 12b. For example, the p doping concentration of the charge region 12c can be in the range of 7e17 to 2e17 cm$^{-3}$.

As further shown in FIG. 1, the separate charge region 12c and the multiplication region 12d have a corrugated configuration. For example, the charge region 12c includes alternating recesses 12c' and protrusions or bumps 12c" of different widths, which effectively provides a variable width configuration for the multiplication region 12d, e.g., reduces the overall cross-sectional area of the multiplication region 12d. In this way, it is possible to reduce breakdown voltage without increasing dark current, in addition to reducing avalanche noise due to a reduced multiplication region. In the embodiment shown in FIG. 1, the alternating recesses 12c' and protrusions or bumps 12c" can include a constant pitch (e.g., constant width and/or distance between features); although other dimensions are also contemplated herein depending on the desired operating parameters.

The contemplated ranges/dimensions of the charge region 12c and the multiplication region 12d can be of different dimensions depending on the desired performance characteristics. Illustratively, for example, variable ranges/dimensions of the widths of the charge region 12c and the multiplication region 12d are provided in Table 1, below. It should be understood by those of ordinary skill in the art that the below ranges can be used in any of the embodiments described herein.

TABLE 1

| Dimension | Values |
| --- | --- |
| W1 | 0.2 μm to 1 μm |
| W2 | 0.2 μm to 1 μm |
| S1 | 0.1 μm to 0.3 μm |
| S2 | 0.1 μm to 0.3 μm |
| C1 | 0.05 μm to 0.15 μm |
| C2 | 0.05 m to 0.15 μm |

Still referring to FIG. 1, a separate absorption region 16 is deposited between the intrinsic region 12d, e.g., multiplication region, and the P region 12b. In this way, the separate absorption region 16 makes no contact with metal material, e.g., contacts 18, 18a. In other words, the absorption region is devoid of contacts.

The separate absorption region 16 is deposited over and in alignment with a waveguide structure 14. In embodiments, the waveguide structure 14 is the same material as the intrinsic region 12d, e.g., multiplication region. Moreover, in embodiments, the absorption region 16 can be Ge or any material that is the same or different than the charge region 12c and the multiplication region 12d. In alternative embodiments, the charge region 12c and the multiplication region 12d can be of the same type of material as the absorption region 16, but with a different doping concentration.

As should be understood by those of skill in the art, a pair of electrons and a hole is generated when the light is absorbed in the separate absorption region 16. The pair of electrons and holes are accelerated according to the applied electric field and the electrons start to move toward the cathode contact 18a and the holes toward the anode contact 18. As soon as the electrons reach the separate multiplication region 12d, they experience an electric field which is higher than the critical value (e.g., for Si it is >1e5 V/cm). As a result, the multiplication or avalanche process initiates. In embodiments, by adjusting the width of the multiplication region 12d, it is possible to adjust the breakdown voltage.

The values and the dimensions of the charge region 12c are two design parameters which define the performance characteristics of the avalanche photodiode. For example, by adjusting the values and the dimensions of the charge region 12c, it is possible to adjust the breakdown voltage and dark current values.

The following equation provides the relation between the breakdown voltage and the width of the depletion region (width of the absorption region and width of the multiplication region) and the multiplication region.

$$V_B = E_m b | E_d (W_D b)$$

where $V_B$ is the breakdown voltage, $E_m$ is a maximum field for avalanche effect, e.g., for silicon it is >3e5 V/cm (3e7 V/m), $E_d$ is a drift region electric field, which is >=1e4 V/cm (1e6 V/m), $W_D$ is a depletion width, e.g., approximately (0.7 μm is the width of the absorption region 16 and 0.3 μm is a width of the multiplication region 12d, whereby near the breakdown the full 1 μm width is depleted), and b is a width of the multiplication (avalanche) region.

From P-N junction theory, the critical electric field can be given by the following equation:

$$E_m = \frac{qN_A W_c}{\epsilon_s} + E_d$$

where, $N_A$ is a charge layer concentration, $W_c$ is charge layer width and $\epsilon$ is $11.9 \times 8.854 \times 10^{-12}$ C.V.m.$^{-1}$.

Table 2 provides a calculation for a charge region with a width of 50 nm and 100 nm, evidencing there is enough electric field in the multiplication region 12d (e.g., >1E5 V/cm) to initiate the avalanche process.

TABLE 2

| Wc (m) | Ed (V/m) | q (C) | Es (C · V/m) | Na (1/m³) | Em (V/cm) |
|---|---|---|---|---|---|
| 5.00E−08 | 1.00E+06 | 1.60E−19 | 1.05E−10 | 7.00E+23 | 5.41E+05 |
| 1.00E−07 | 1.00E+06 | 1.60E−19 | 1.05E−10 | 7.00E+23 | 1.07E+06 |

Figure 2:
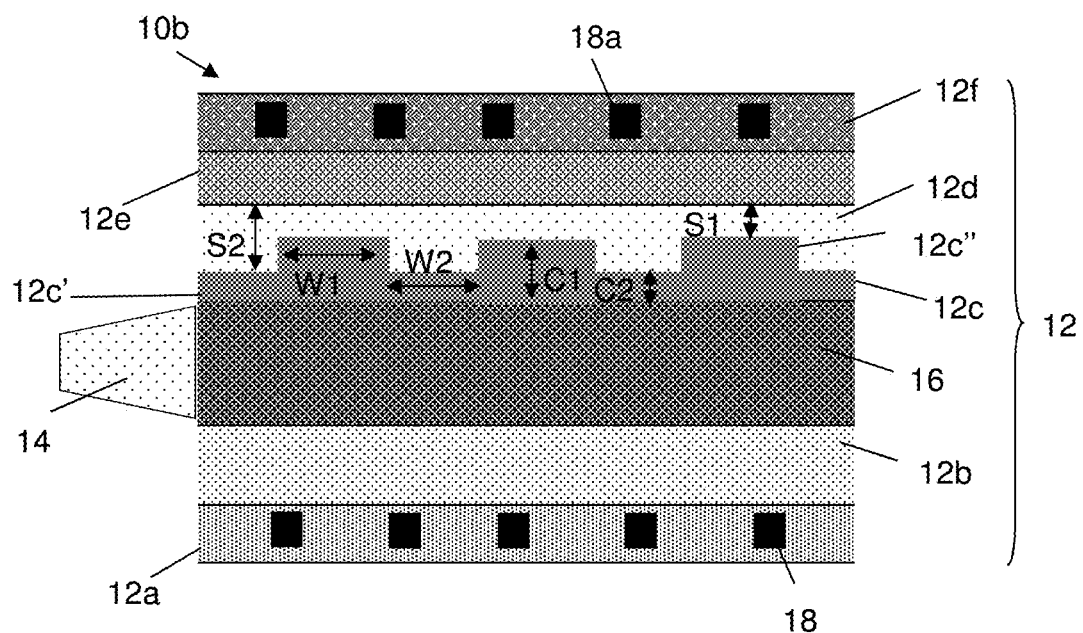
FIG. 2 shows a top down view of an avalanche photodiode in accordance with additional aspects of the present disclosure.

FIG. 2 shows a top down view of an avalanche photodiode in accordance with additional aspects of the present disclosure. More specifically, the avalanche photodiode 10b of FIG. 2 includes a corrugated charge region 12c, which has its recesses 12c' and protrusions or bumps 12c" offset from that shown in FIG. 1, e.g., the width C2 is provided along the edge of the structure. The remaining features are similar to that already described with respect to FIG. 1.

Figure 3:
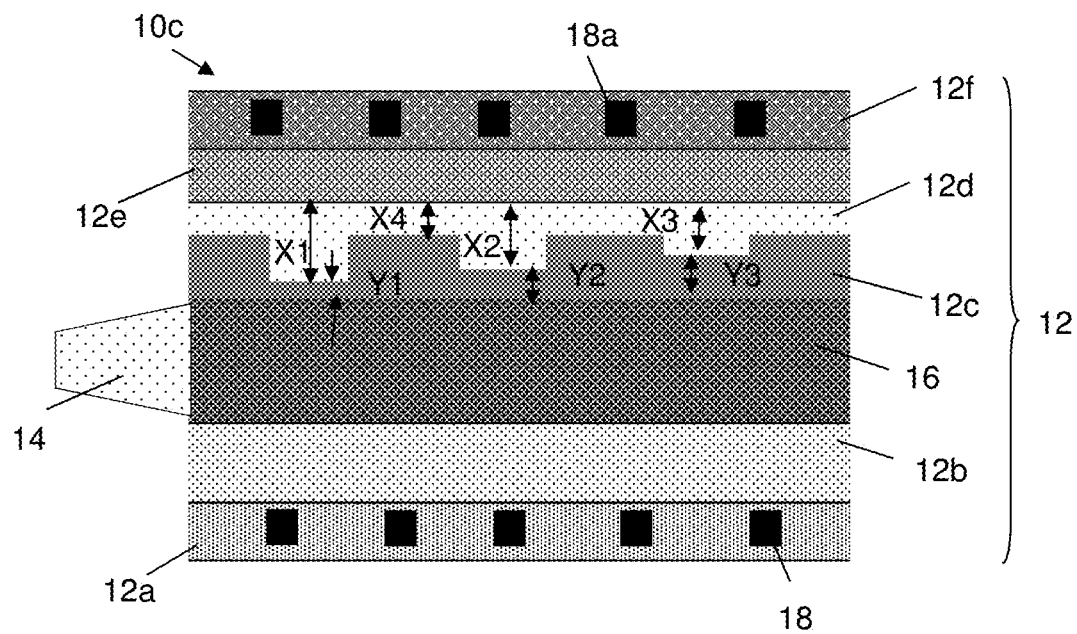
FIG. 3 shows a top down view of an avalanche photodiode in accordance with additional aspects of the present disclosure.

FIG. 3 shows another variation of the avalanche photodiode 10c in accordance with aspects of the present disclosure. In FIG. 3, the avalanche photodiode 10c includes a corrugated charge region 12c and multiplication region 12d with a variable gradient pitch as shown by dimensions Y1, Y2 and Y3 for the charge region 12c, and X1, X2, X3 and X4 for the multiplication region 12d. In this example, Y1<Y2<Y3 and X1>X2>X3>X4. By varying the dimensions Y1, Y2, Y3 and X1, X2, X3, X4, it is possible to individually adjust the dark current and breakdown voltage. The remaining features are similar to that already described with respect to FIG. 1.

Figure 4:
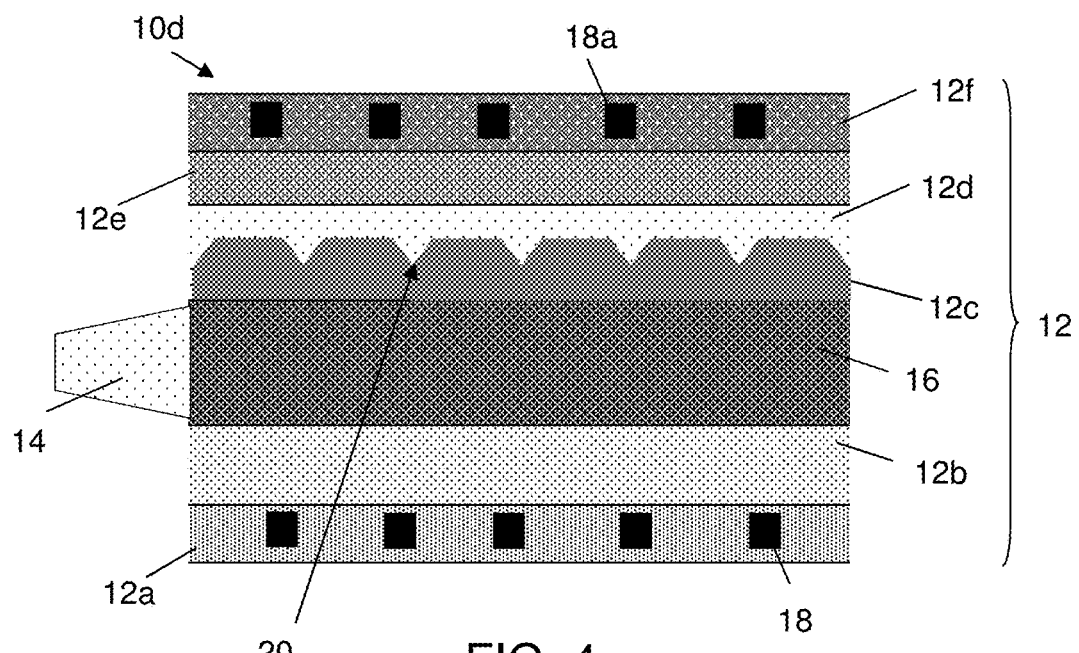
FIG. 4 shows a top down view of an avalanche photodiode in accordance with additional aspects of the present disclosure.

FIG. 4 shows another variation of the avalanche photodiode 10d in accordance with aspects of the present disclosure. In FIG. 4, the avalanche photodiode 10d includes a charge region 12c having "v" shaped notches 20. It should be understood by those of ordinary skill in the art that other shaped notches are also contemplated herein, e.g., round, oval, rectangular, square, etc. The notches 20 effectively result in a variable width for both the charge region 12c and the multiplication region 12d. By varying the dimensions (depth) of the notch 20, it is possible to individually adjust the dark current and breakdown voltage. The remaining features are similar to that already described with respect to FIG. 1.

Figure 5:
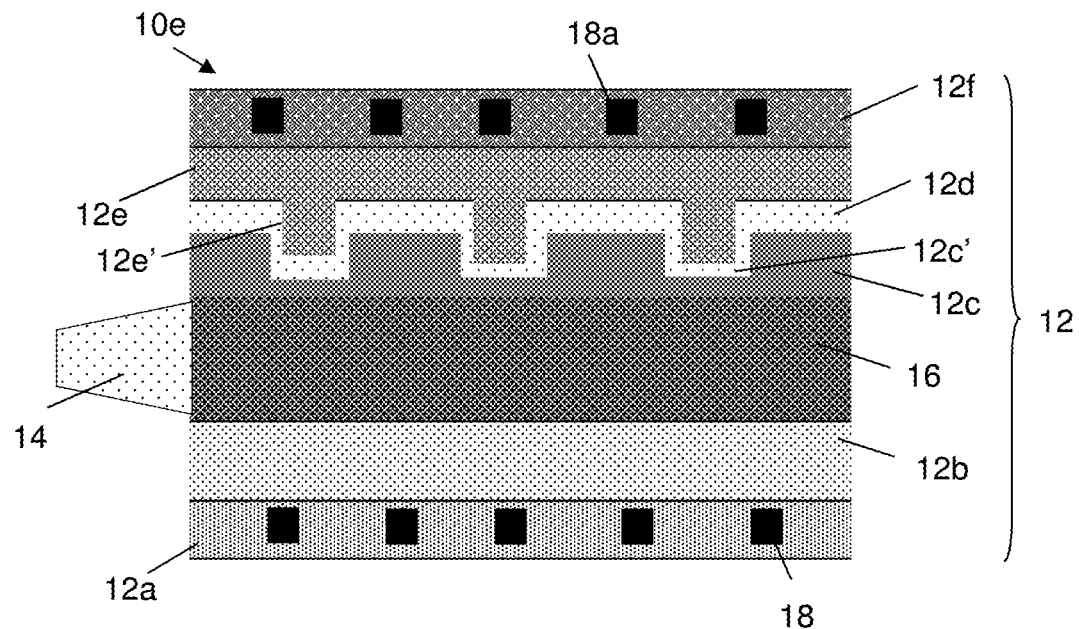
FIG. 5 shows a top down view of an avalanche photodiode in accordance with additional aspects of the present disclosure.

FIG. 5 shows another variation of the avalanche photodiode 10e in accordance with aspects of the present disclosure. In FIG. 5, the avalanche photodiode 10e includes N region 12e with downward extending protrusions or bumps 12e' extending into the multiplication region 12d and within the recesses 12c' of the corrugated charge region 12c. The downward extending protrusions or bumps 12e' effectively result in a variable width for both the charge region 12c and the multiplication region 12d. By varying the dimensions (depth) of the protrusions or bumps 12e', it is also possible to individually adjust the dark current and breakdown voltage. The remaining features are similar to that already described with respect to FIG. 1.

Figure 6:
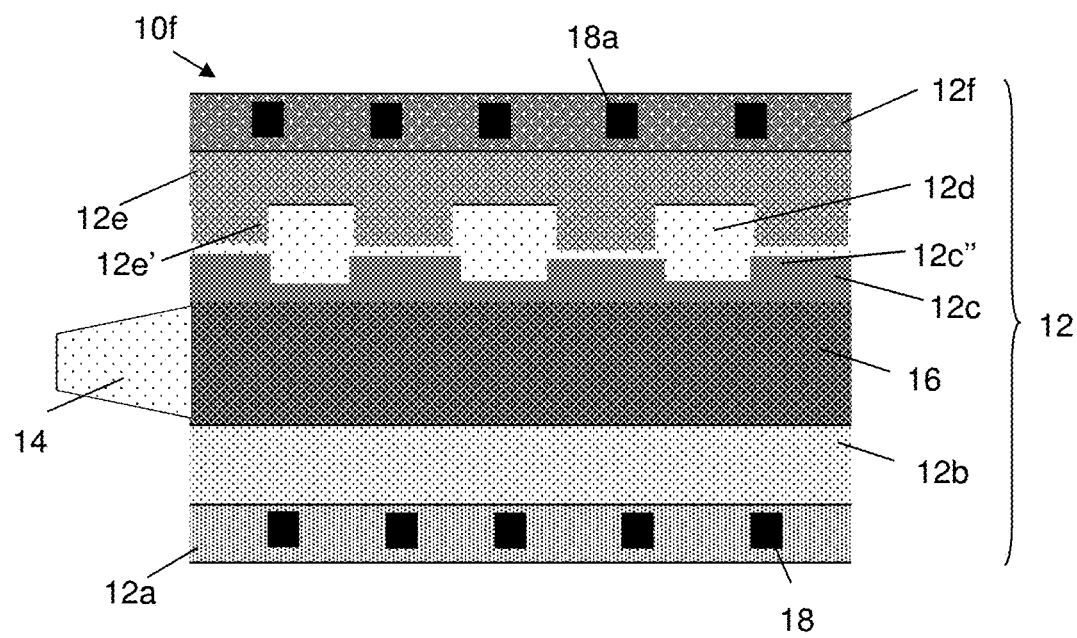
FIG. 6 shows a top down view of an avalanche photodiode in accordance with additional aspects of the present disclosure.

FIG. 6 shows another variation of the avalanche photodiode 10f in accordance with aspects of the present disclosure. In FIG. 6, the avalanche photodiode 10f includes N region 12e with the downward extending protrusions or bumps 12e' extending into the multiplication region 12d and aligned with the protrusions 12c" of the charge region 12c. This configuration also effectively results in a variable width for both the charge region 12c and the multiplication region 12d. By varying the dimensions (depth) of the protrusions or bumps 12e', it is again possible to individually adjust the dark current and breakdown voltage. The remaining features are similar to that already described with respect to FIG. 1.

Figure 7:
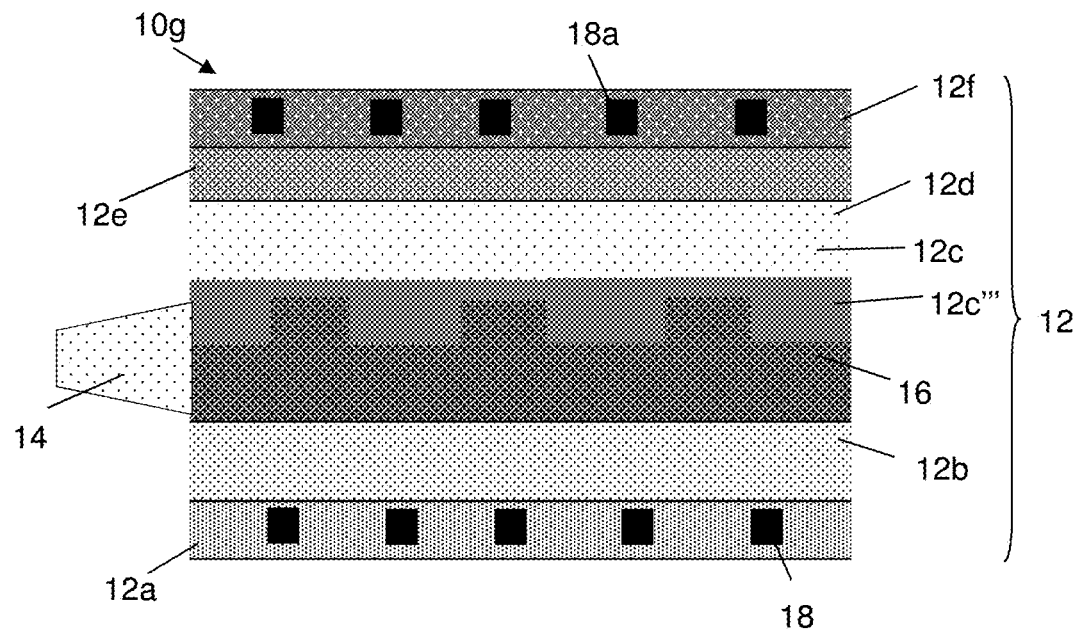
FIG. 7 shows a top down view of an avalanche photodiode in accordance with additional aspects of the present disclosure.

FIG. 7 show another variation of the avalanche photodiode 10g in accordance with aspects of the present disclosure. In FIG. 7, the avalanche photodiode 10g includes downward extending protrusions 12c''', extending into the absorption region 16. In this way, the charge region 12c will include an overlap charge region within the absorption region 16, e.g., Si or Ge absorption region. The remaining features are similar to that already described with respect to FIG. 1.

Figure 8:
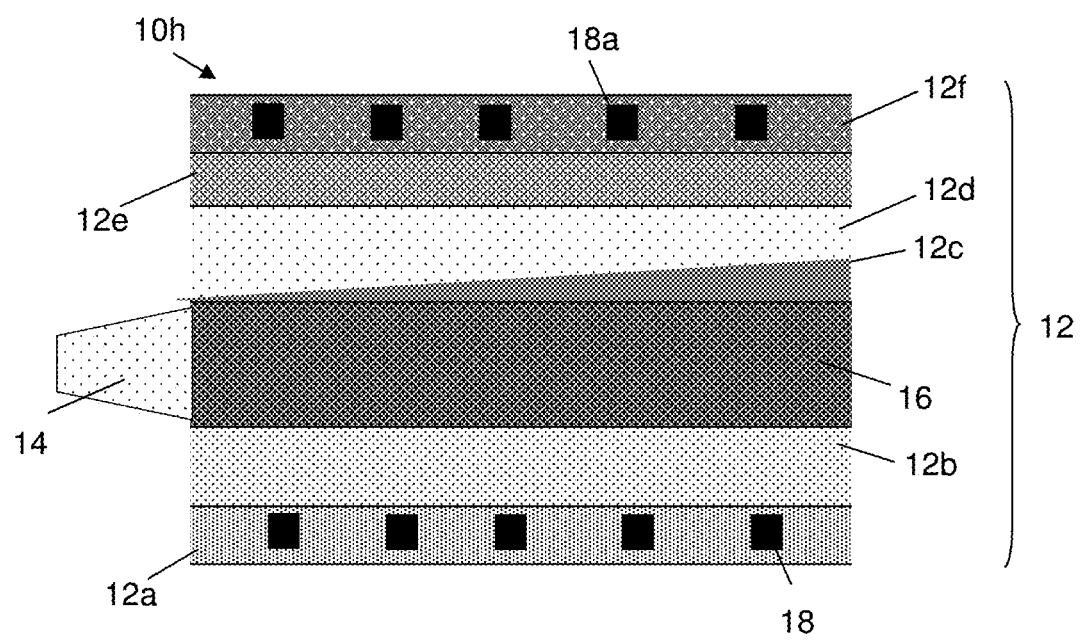
FIG. 8 shows a top down view of an avalanche photodiode in accordance with additional aspects of the present disclosure.

FIG. 8 shows another variation of the avalanche photodiode 10h in accordance with aspects of the present disclosure. In FIG. 8, the avalanche photodiode 10h includes tapered charge region 12c, which will also effectively reduce the cross-sectional area of the multiplication region 12d. By varying the dimensions (depth) of the taper, it is possible to individually adjust the dark current and breakdown voltage. The remaining features are similar to that already described with respect to FIG. 1.

Table 3 provides a comparison of breakdown voltage of a corrugated charge region device compared to avalanche photodiodes which have a fixed width for both the charge layer and multiplication layer. As shown in the below table, the corrugated structures provide reduced breakdown voltage while maintaining the same dark current. It should be recognized that the device parametric can include different charge region pitch, length and width to optimize its parameters. Also, the different doping concentration in the charge regions can further reduce the dark current and breakdown voltage.

TABLE 3

| Case | Parameter | Dimensions (nm) | Breakdown Voltage, V_b (V) | Dark Current, I_dar (nA) |
|---|---|---|---|---|
| case 1: Non-corrugated layer | Width_Charge<br>Width_Multiplication | 50<br>300 | 14.5 | 30 |
| case 2: Non-corrugated layer | Width_Charge<br>Width_Multiplication | 100<br>250 | 13.8 | 30 |
| case 3: corrugated layer in accordance with the present disclosure | Width_Charge 1<br>Width_Multiplication 1<br>Width_Charge 2<br>Width_Multiplication 2<br>Pitch<br>Length_Charge 1<br>Length_Charge 2 | 50<br>300<br>100<br>250<br>400<br>200<br>200 | 13 | 30 |

FIGS. 9A-9F show respective fabrication processes for manufacturing an avalanche photodiode in accordance with additional aspects of the present disclosure. The avalanche photodiodes can be manufactured in a number of ways using a number of different tools. In general, though, the methodologies, i.e., technologies, employed to manufacture the avalanche photodiodes are built on wafers and are realized in films of material patterned by photolithographic processes on the top of a wafer. In particular, the fabrication of the avalanche photodiodes uses three basic building blocks: (i) deposition of thin films of material on a substrate, (ii) applying a patterned mask on top of the films by photolithographic imaging, and (iii) etching the films selectively to the mask.

Figure 9A:
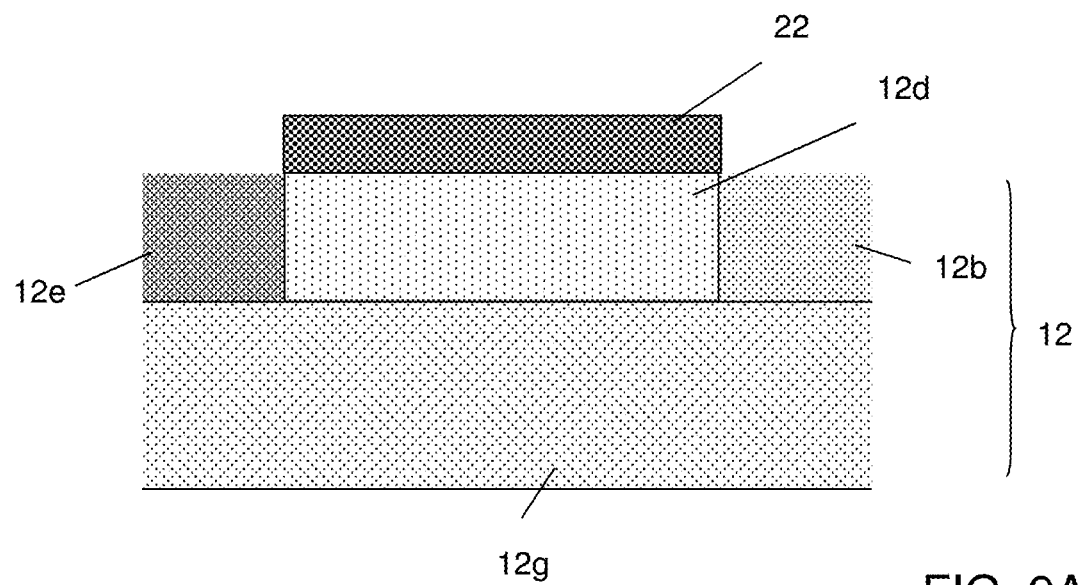
FIGS. 9A-9F show respective fabrication processes for manufacturing an avalanche photodiode in accordance with additional aspects of the present disclosure.

More specifically, FIG. 9A shows a substrate 12 which is doped to form the P region 12b and the N region 12e. In embodiments, the substrate 12 can be composed of SOI technologies. In the SOI technologies, an insulator layer 12g is provided on top of a handle wafer (e.g., bulk silicon). The insulator layer 12g comprises any suitable material, including a buried oxide layer (BOX). The insulator layer 12g is formed by any suitable process, such as separation by implantation of oxygen (SIMOX), oxidation, deposition, and/or other suitable process. A semiconductor layer is then formed on top of an insulator layer 12g, which is then subjected to an ion implantation process to form the P region 12b and the N region 12e.

In the implantation process, a concentration of a dopant is provided in the substrate 12. For example, the P region 12b and the N region 12e may be formed by introducing a concentration of a different dopant of opposite conductivity type in the substrate 12, while protecting non-doped regions, e.g., intrinsic region 12d, with a hardmask (patterned implantation masks) represented at reference numeral 22. In embodiments, respective patterned implantation masks may be used to define selected areas exposed for the implantations.

The implantation masks 22 may include a layer of a light-sensitive material, such as an organic photoresist, applied by a spin coating process, pre-baked, exposed to light projected through a photomask, baked after exposure, and developed with a chemical developer. The implantation mask 22 has a thickness and stopping power sufficient to block masked areas against receiving a dose of the implanted ions. The P region 12b is doped with p-type dopants, e.g., Boron (B), and the N region 12e is doped with n-type dopants, e.g., Arsenic (As), Phosphorus (P) and Sb, among other suitable examples. The implantation mask used to select the exposed area for forming the P region 12b and the N region 12e is stripped after the implantation process.

Figure 9B:
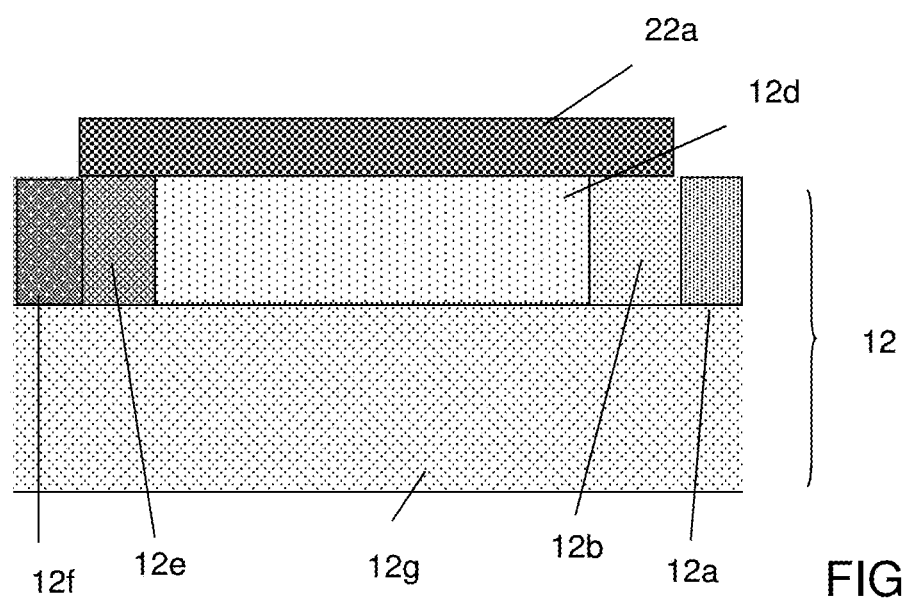

In FIG. 9B, the P+ region 12a and N+ region 12f are formed by an additional ion implantation process and with use of hardmask 22a. In this step, the hardmask 22a will protect portions of the P region 12b and the N region 12e (and intrinsic region) during the ion implantation process of the P+ region 12a and N+ region 12f. In embodiments, the dosage and/or concentration of the ion implantation for the P+ region 12a and N+ region 12f is higher than that for the P region 12b and the N region 12e, respectively, using similar dopant types as noted with respect to FIG. 9A. The hardmask 22a is removed after the ion implantation process for the P+ region 12a and N+ region 12f.

Figure 9C:
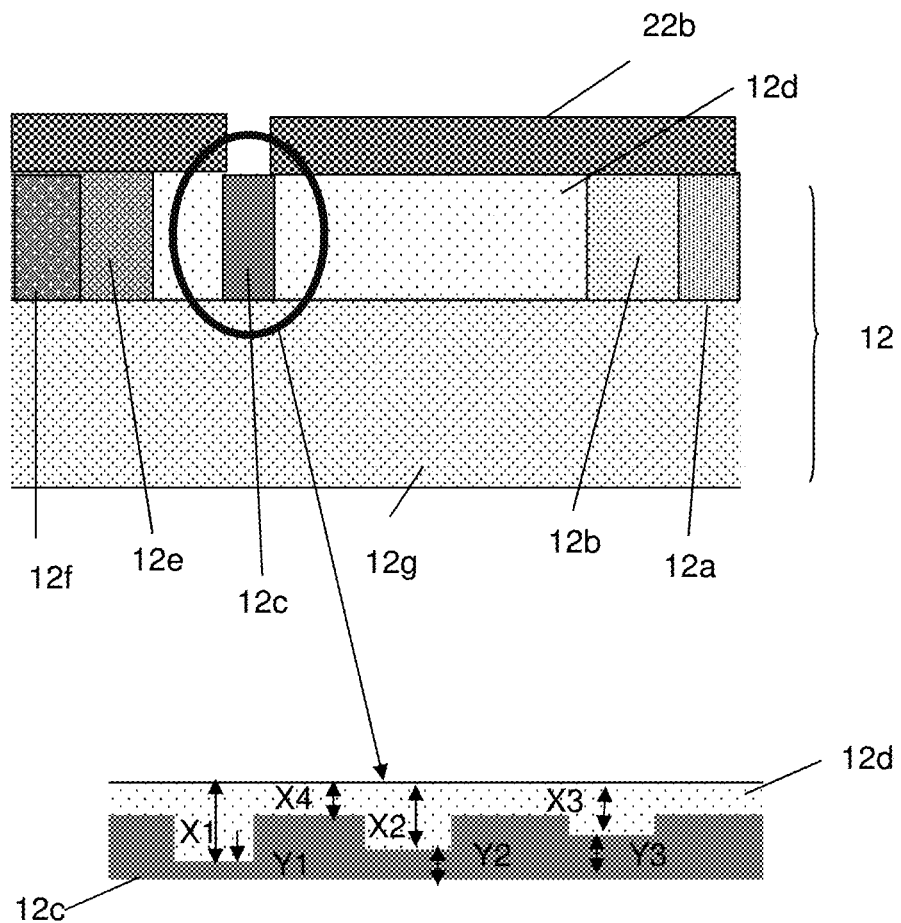

In FIG. 9C, the P− region 12c, e.g., charge region, is formed by an additional ion implantation process. In this process, a hardmask 22b will define the charge region 12c, while protecting regions 12a, 12b, 12d, 12e and 12f, during the ion implantation process of the charge region 12c. In embodiments, the dosage and/or concentration of the ion implantation for the charge region 12c, e.g., P− region, will be less than that for the P+ region 12a and P region 12b, using similar dopant types as noted with respect to FIG. 9A. After the ion implantation process, the hardmask 22b will be removed.

Figure 9D:
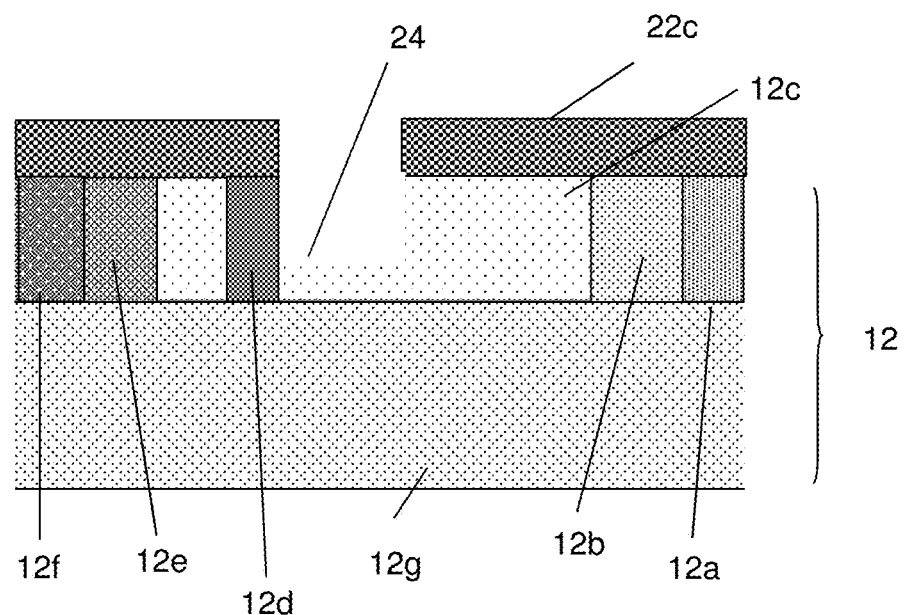
Figure 9E:
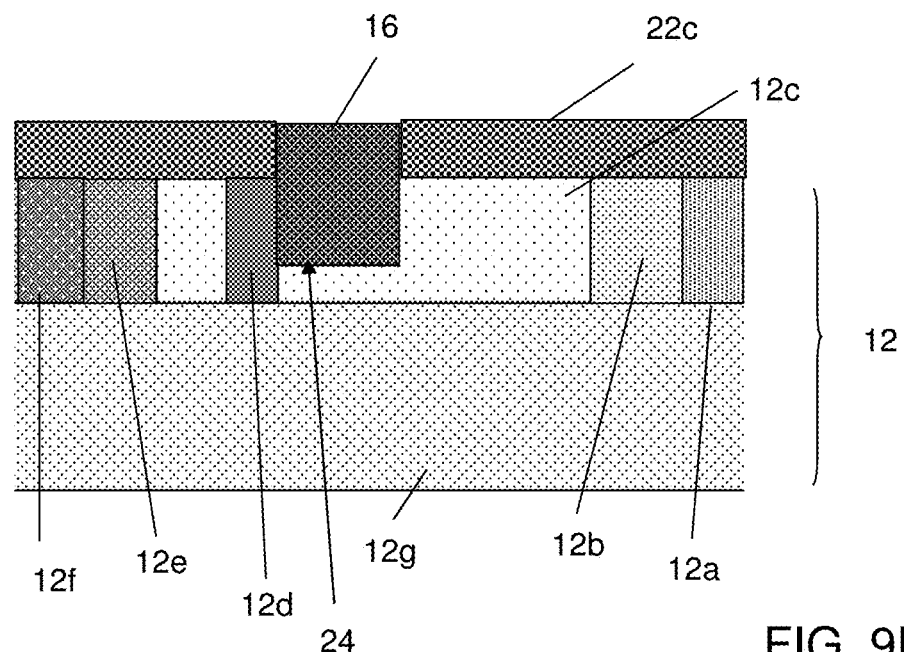

FIGS. 9D and 9E show the formation of the absorption region 16. In embodiments, the absorption region 16 can be formed by conventional lithography, etching and deposition methods known to those of skill in the art. For example, a resist (hardmask) 22c formed over the substrate 12 is exposed to energy (light) to form a pattern (opening). An etching process through the openings of the resist with a selective chemistry, e.g., reactive ion etching (RIE), will be used to form a trench 24 in the substrate 12, adjacent to and in contact with the P− region 12c, e.g., charge region. The material of the absorption region 16 can be epitaxial grown on the substrate 12, within the trench 12.

Figure 9F:
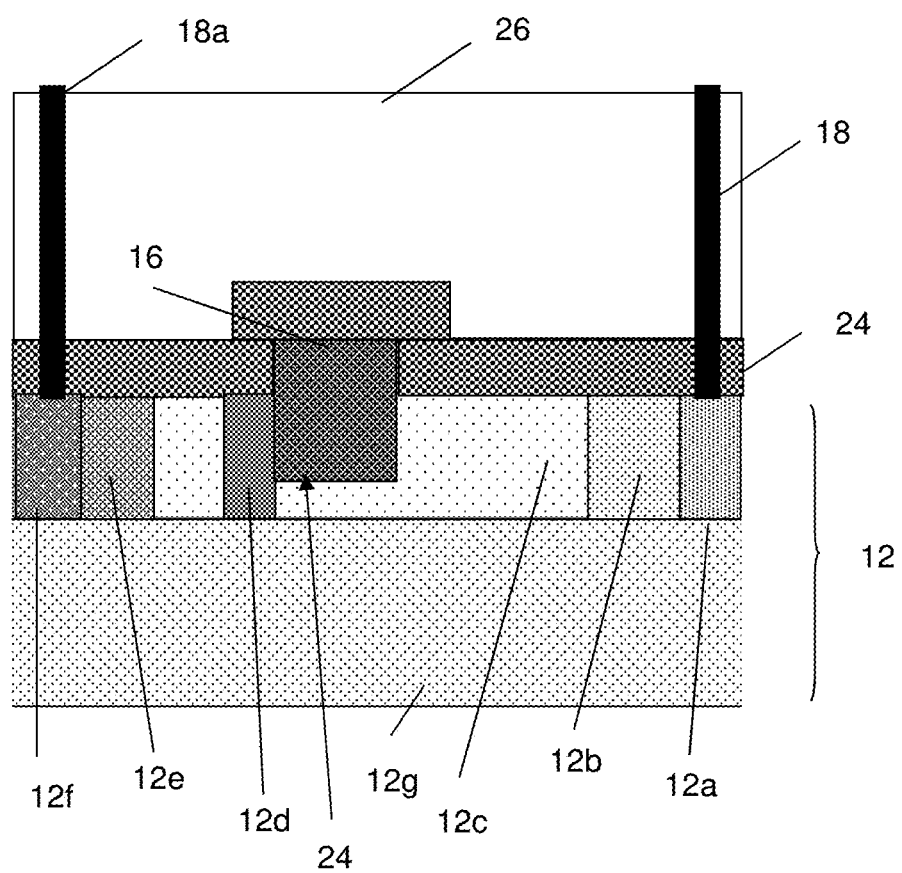

In FIG. 9F, the resist can be removed by a conventional oxygen ashing process or other known stripants. Following the resist removal, a spacer material 24 can be deposited by any conventional deposition processes, e.g., chemical vapor deposition (CVD) processes. In embodiments, the spacer material 24 can be composed of SiN material. An insulator material 26 is deposited over the spacer material 24, followed by formation of contacts 18, 18a. The insulator material 26 is deposited by conventional CVD processes, for example. The contacts 18, 18a are formed by conventional lithography, etching and deposition processes, as described already, followed by a chemical mechanical planarization (CMP) process.

Figure 10:
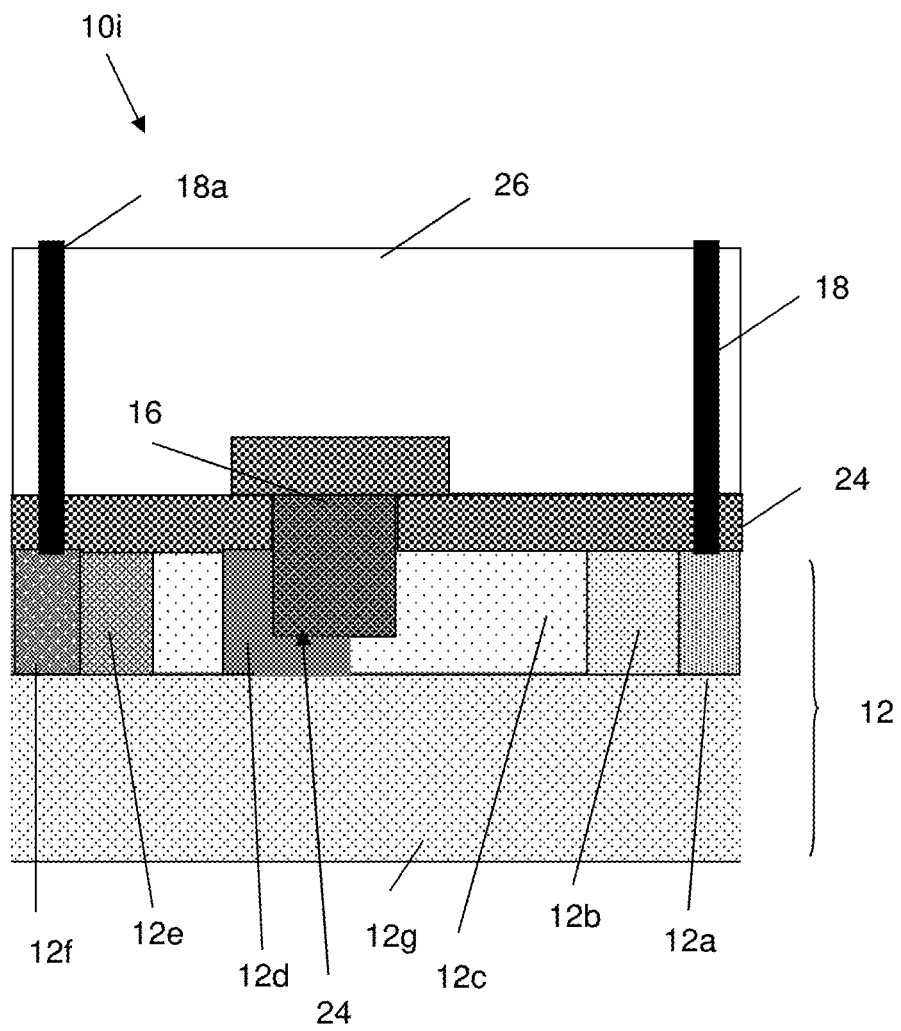
FIG. 10 shows a cross-sectional view of an alternative avalanche photodiode and respective fabrication processes in accordance with aspects of the present disclosure.

FIG. 10 shows an alternative structure, e.g., avalanche photodiode 10i, and respective fabrication processes. In this implementation, the charge region 12c will extend partially under the P− region 12c, e.g., charge region. In this way, the charge region 12 will overlap with the intrinsic region 12c and the absorption region 18.

The avalanche photodiodes can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a charge region having a first doping concentration and a variable width;
a multiplication region adjacent to the variable width charge region; and
an absorption region adjacent to the variable width charge region.

2. The structure of claim 1, wherein the variable width charge region has a corrugated configuration comprising protrusions and recesses.

3. The structure of claim 2, wherein the protrusions and recesses have a constant pitch.

4. The structure of claim 2, wherein the recesses have a variable gradient pitch.

5. The structure of claim 2, wherein the multiplication region has a corrugated configuration comprising protrusions and recesses which are offset from the protrusions and recesses of the variable width charge region.

6. The structure of claim 2, wherein the multiplication region has a corrugated configuration comprising protrusions and recesses which are aligned with the protrusions and recesses of the variable width charge region.

7. The structure of claim 2, wherein the protrusions of the variable width charge region extend or overlap with the absorption region.

8. The structure of claim 1, wherein the variable width charge region has a tapered configuration.

9. The structure of claim 1, wherein the variable width charge region includes notches.

10. The structure of claim 1, further comprising a doped region which extends to within the multiplication region resulting in the multiplication region having a variable width.

11. A structure comprising:
a waveguide structure comprising intrinsic semiconductor material;
a charge region having a doping concentration of a first type and a variable width;
a multiplication region adjacent to the variable width charge region and being composed of the intrinsic semiconductor material; and
an absorption region adjacent to the waveguide structure and the variable width charge region.

12. The structure of claim 11, wherein the variable width charge region has a corrugated configuration comprising protrusions and recesses.

13. The structure of claim 12, wherein one of:
the multiplication region has a corrugated configuration comprising protrusions and recesses which are offset from the protrusions and recesses of the variable width charge region; and
the multiplication region has a corrugated configuration comprising protrusions and recesses which are aligned with the protrusions and recesses of the variable width charge region.

14. The structure of claim 12, wherein the absorption region is composed of a same or different material than the charge region and the multiplication region.

15. The structure of claim 12, wherein the protrusions of the variable width charge region extend to within the absorption region.

16. The structure of claim 12, wherein the variable width charge region overlaps with the absorption region.

17. The structure of claim 11, wherein the variable width charge region has a tapered configuration.

18. A structure comprising:
a first semiconductor region having a first dopant concentration of a first type;
a second semiconductor region adjacent to the first semiconductor region and having a second dopant concentration of the first type that is different than the first dopant concentration of the first type;
a waveguide structure comprising intrinsic semiconductor material;
a charge region having a third doping concentration of the first type and a variable width;
a multiplication region adjacent to the variable width charge region and being composed of the intrinsic semiconductor material;
an absorption region adjacent to the waveguide structure and the variable width charge region;
a third semiconductor region adjacent to the multiplication region and having a first dopant concentration of a second type; and
a fourth semiconductor region adjacent to the third semiconductor region and having a second dopant concentration of the second type, the second dopant concentration being different than the first dopant concentration of the second type.

19. The structure of claim 18, wherein the variable width charge region has a corrugated configuration comprising protrusions and recesses and the multiplication region has a corrugated configuration comprising protrusions and recesses.

20. The structure of claim 18, wherein the variable width charge region overlaps with the absorption region.

* * * * *